United States Patent
Stout et al.

(10) Patent No.: US 9,070,747 B2
(45) Date of Patent: Jun. 30, 2015

(54) ELECTROPLATING USING DIELECTRIC BRIDGES

(71) Applicant: FlipChip International, LLC, Phoenix, AZ (US)

(72) Inventors: Eugene A. Stout, Phoenix, AZ (US); Douglas M. Scott, Phoenix, AZ (US); Anthony P. Curtis, Queen Creek, AZ (US); Theodore G. Tessier, Chandler, AZ (US); Guy F. Burgess, Gilbert, AZ (US)

(73) Assignee: Flipchip International LLC, Phoenix, AZ (US)

( * ) Notice: Subject to any disclaimer, the term of this patent is extended or adjusted under 35 U.S.C. 154(b) by 85 days.

(21) Appl. No.: 14/039,384

(22) Filed: Sep. 27, 2013

(65) Prior Publication Data

US 2015/0001684 A1    Jan. 1, 2015

Related U.S. Application Data

(60) Provisional application No. 61/840,346, filed on Jun. 27, 2013.

(51) Int. Cl.
*H01L 23/544* (2006.01)
*H01L 21/768* (2006.01)
*H01L 21/78* (2006.01)
*H01L 23/31* (2006.01)

(52) U.S. Cl.
CPC .......... *H01L 21/76837* (2013.01); *H01L 21/78* (2013.01); *H01L 23/3171* (2013.01); *H01L 23/3192* (2013.01)

(58) Field of Classification Search
USPC .......... 257/620, 527, 594, 618, 622, 257/E29.111–E29.165, E23.01–E23.079, 257/E23.141–E23.179, 678–733, 787–796, 257/E23.001–E23.194, E21.499–E21.519, 257/666–733, E23.031–E23.059, E23.004, 257/E23.043–E23.05, E23.005–E23.009; 438/571, 597, 15, 26, 51, 55, 64, 106, 438/124–127, 611–688, 113, 299
See application file for complete search history.

(56) References Cited

U.S. PATENT DOCUMENTS 8,030,180 B2 * 10/2011 Yoshino ........................ 438/462

* cited by examiner

*Primary Examiner* — Dao H Nguyen
*Assistant Examiner* — Tram H Nguyen
(74) *Attorney, Agent, or Firm* — Arno T. Naeckel

(57) ABSTRACT

Structures and methods provide a dielectric bridge for use in electroplating. A method comprises: providing a semiconductor wafer with a plurality of die, wherein a first die is adjacent to a second die, and the first die and second die are separated by a dicing street area; forming a patterned dielectric layer overlying the semiconductor wafer, the dielectric layer including a dielectric bridge that crosses the dicing street area; forming a conductive layer (e.g., a metal seed layer) overlying the dielectric layer, wherein a portion of the conductive layer is overlying the dielectric bridge to provide a current pathway from the first die to the second die; and electroplating targeted areas of the conductive layer by providing current to the second die using the current pathway. Other such bridges formed from the dielectric layer provide current pathways to other die on the wafer.

20 Claims, 7 Drawing Sheets

ELECTROPLATING USING DIELECTRIC BRIDGES

RELATED APPLICATIONS

This application claims priority to U.S. Provisional Application Ser. No. 61/840,346, filed Jun. 27, 2013, entitled "ELECTROPLATING DIELECTRIC BRIDGES," by Stout et al., the entire contents of which application is incorporated by reference as if fully set forth herein.

FIELD OF THE TECHNOLOGY

At least some embodiments disclosed herein generally relate to a structure and method for semiconductor devices, and more particularly, but not limited to, a dielectric bridge structure and method for wafer-level chip-scale devices and flip-chip devices.

BACKGROUND

Additive electroplating processes on targeted areas of the surface of a semiconductor device are established bumping technologies in the semiconductor industry. Two primary components for electroplating targeted areas on the surface of a semiconductor device include a deposited conductive metal seed layer (which can be comprised of one, two or more stacked layers of deposited metal) that provides an electrically continuous current pathway to the targeted areas of the device, and a masking-type resist material on top of the metal seed layer that defines the areas targeted for plating by covering the areas where additive plating is not desired.

The use of additive electroplating bumping technologies has oftentimes been frustrated by the absence of plating occurring in all targeted locations or with locations having severely uneven plating. Subsequent analysis has routinely determined that the deposited metal seed layer had been discontinuous due to the topography of wafer features. The most predominant type of topographical issue causing discontinuity or break in the metal seed layer is an adverse sidewall profile of a dielectric layer(s) or a slightly lifted dielectric layer(s) at the dielectric edges beneath the deposited seed layer.

Semiconductor fabricators have desired to ensure that their processes create dielectric edges around each die that have the appropriate sidewall angles and to keep the dielectric layer from lifting up at the edges to ensure subsequently-deposited metal seed layers have a continuous conductive pathway over the surface of the wafer. Some fabricators have attempted to solve this problem by creating one continuous blanket layer of dielectric covering the wafer, requiring them to dice through this layer (but most fabricators choose not to do this due to the complications it causes). It has been widely known in the industry for more than 25 years that keeping saw streets clear of dielectric is an important practice to avoid chipping of the dielectric and resultant poor dicing quality.

SUMMARY OF THE DESCRIPTION

Structures and methods to provide a dielectric bridge for use in electroplating are described herein. Some embodiments are summarized in this section.

In one embodiment, a method includes: providing a semiconductor wafer comprising a plurality of die, the plurality of die including a first die and a second die, wherein the first die is adjacent to the second die, and the first die and second die are separated by a dicing street area; forming a patterned dielectric layer overlying the semiconductor wafer, the dielectric layer comprising at least one dielectric bridge that crosses the dicing street area; forming a conductive layer overlying the dielectric layer, a portion of the conductive layer overlying the at least one dielectric bridge to provide a current pathway from the first die to the second die; and electroplating targeted areas of the conductive layer, wherein the electroplating comprises providing current to the second die using the current pathway.

The disclosure includes structures used in these methods. Other features will be apparent from the accompanying drawings and from the detailed description which follows.

BRIEF DESCRIPTION OF THE DRAWINGS

The embodiments are illustrated by way of example and not limitation in the figures of the accompanying drawings in which like references indicate similar elements.

DETAILED DESCRIPTION

The following description and drawings are illustrative and are not to be construed as limiting. Numerous specific details are described to provide a thorough understanding. However, in certain instances, well known or conventional details are not described in order to avoid obscuring the description. References to one or an embodiment in the present disclosure are not necessarily references to the same embodiment; and, such references mean at least one.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Typically, dicing street areas are kept clear of certain dielectric layers to avoid complications from saw tool wear and residual defects. As such, these particular dielectric layers are usually terminated at or near each die edge on a semiconductor wafer during processing. Some dielectric layers are terminated away from the die edge.

At the edge of termination, dielectric layers require appropriate sidewall angles or slopes in order to accommodate a subsequently-deposited metal seed layer for continuous electrical contact during a subsequent additive electroplating process. In approaches that do not use a dielectric bridge, an electrically-discontinuous seed layer can occur over a wafer surface due to vertical or near-vertical dielectric sidewall angles or retrograde sidewall angles, or if the edges of the dielectric layer slightly lift up. The foregoing can prevent an additive plating process from forming plated bumping features on all targeted areas of the wafer. In contrast, a reliable and manufacturable structure and method to provide a continuous current pathway for additive plating processes on semiconductor devices is described below.

More specifically, this disclosure provides a means to significantly improve the ability to uniformly plate on all targeted die by creating an electrically-continuous seed layer pathway using dielectric bridges between the dielectric layers on adjacent die over the dicing street areas and, in some embodiments, over any other localized on-chip topography to facilitate plating across all desired areas of the wafer. The dielectric bridges over the dicing street areas will allow for subsequent wafer singulation (e.g., through saw dicing or laser dicing) with minimal saw wear or residual dielectric issues.

Figure 1:
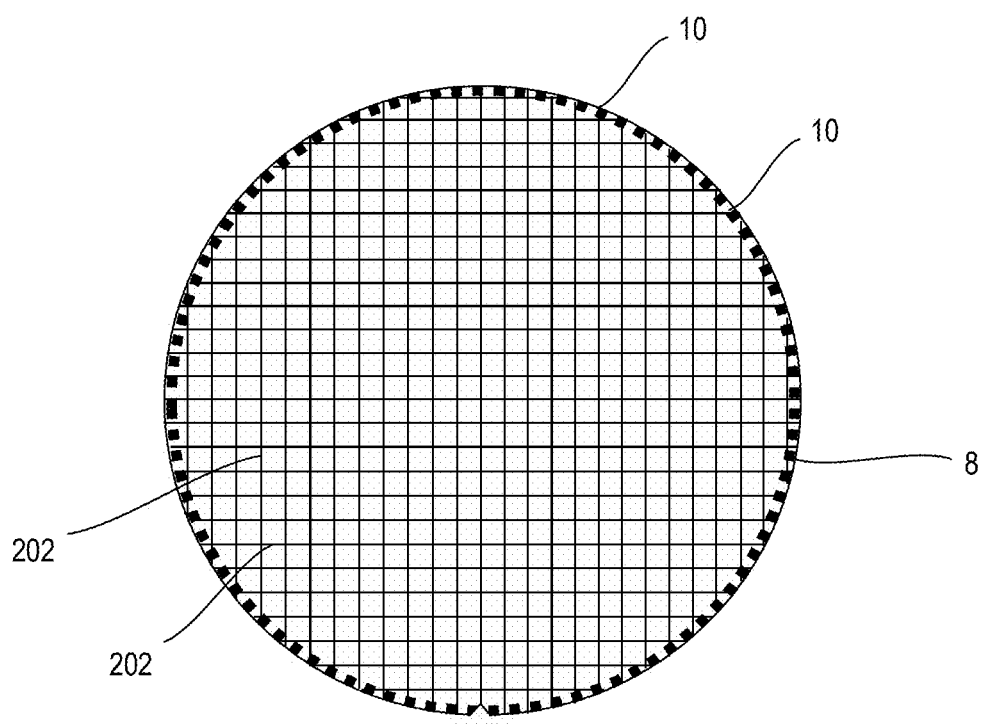
FIG. 1 illustrates a semiconductor wafer 8 having dicing street areas 202 separating a plurality of die. Wafer 8 has been coated with a metal seed layer (described in more detail below). Electrical current contacts 10 are located around the perimeter at the edge of wafer 8 for applying an electric current in an additive electroplating process as described below.

FIG. 1 illustrates a top-down view of a semiconductor wafer 8 with a plurality of die defined by dicing street areas 202 over the surface of wafer 8. The wafer surface is coated with a deposited metal seed layer. Around the perimeter of the wafer are points of electrical current contact 10 that connect electroplating tooling to the metal seed layer for use in an additive electroplating process as described below (in an alternative embodiment, current contacts may be provided at interior locations on the wafer such as, for example, near the center of the wafer). During this electroplating process, electrical current flows over the surface of the wafer through the deposited metal seed layer (using dielectric bridges 106 as illustrated and described herein) to all targeted areas on wafer 8. In one embodiment, the targeted areas may be defined by a pattern formed in a photoresist layer (not shown) prior to the electroplating process. More specifically, in one embodiment, to define the targeted areas for plating, a masking type resist material is placed over the areas of the wafer where additive plating is not desired.

Figure 2:
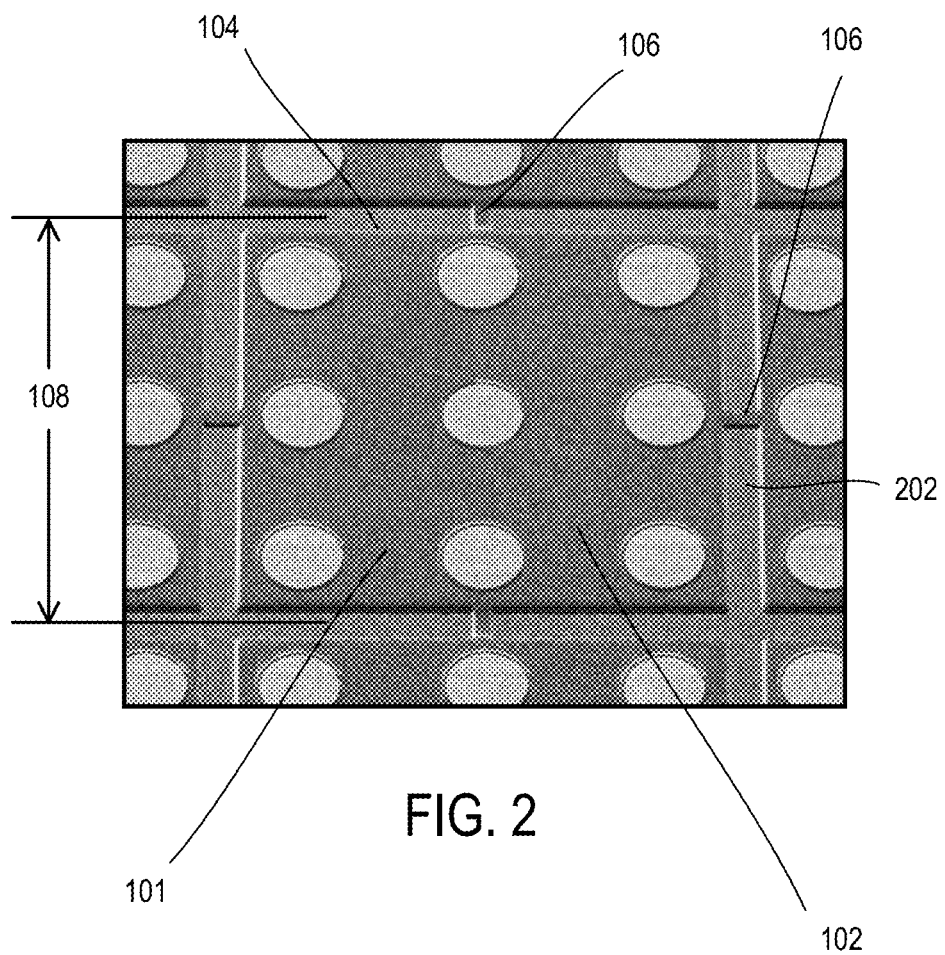
FIG. 2 illustrates four dielectric bridges 106 over dicing street areas 202 allowing a metal seed layer to electrically connect a first die 101 to four adjacent die during an electroplating process, according to one embodiment.

FIG. 2 illustrates an oblique view of a die 101 with a dielectric layer 102 that terminates at a die edge 104, according to one embodiment. This view also shows four dielectric bridges 106 over dicing street areas 202 allowing a subsequently deposited metal seed layer to electrically connect die 101 to the four adjacent die with a minimized risk of a break in the seed layer. The circular features in FIG. 2 are openings in dielectric layer 102 to underlying metal pads (i.e., base metal) and are the locations where the subsequent additive plating will occur. In FIG. 2, each die has a device die dimension 108, as illustrated, which is determined by measuring from the center of a die street on one side of a die to the center of another die street on the other side of the same die.

Figure 3:
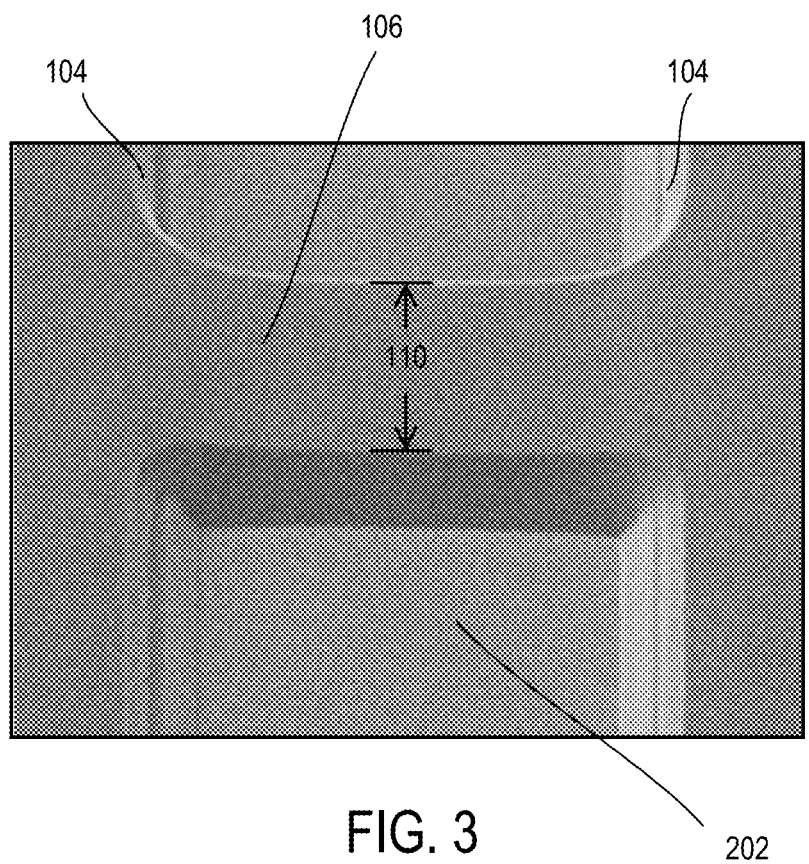
FIG. 3 illustrates an oblique close-up view of dielectric bridge 106 spanning across a dicing street area 202 between two adjacent dielectric edges 104, according to one embodiment.

FIG. 3 illustrates an oblique close-up view of dielectric bridge 106 spanning across the dicing street area 202 between two adjacent dielectric edges 104. In FIG. 3, dielectric bridge 106 has a width 110.

Figure 4:
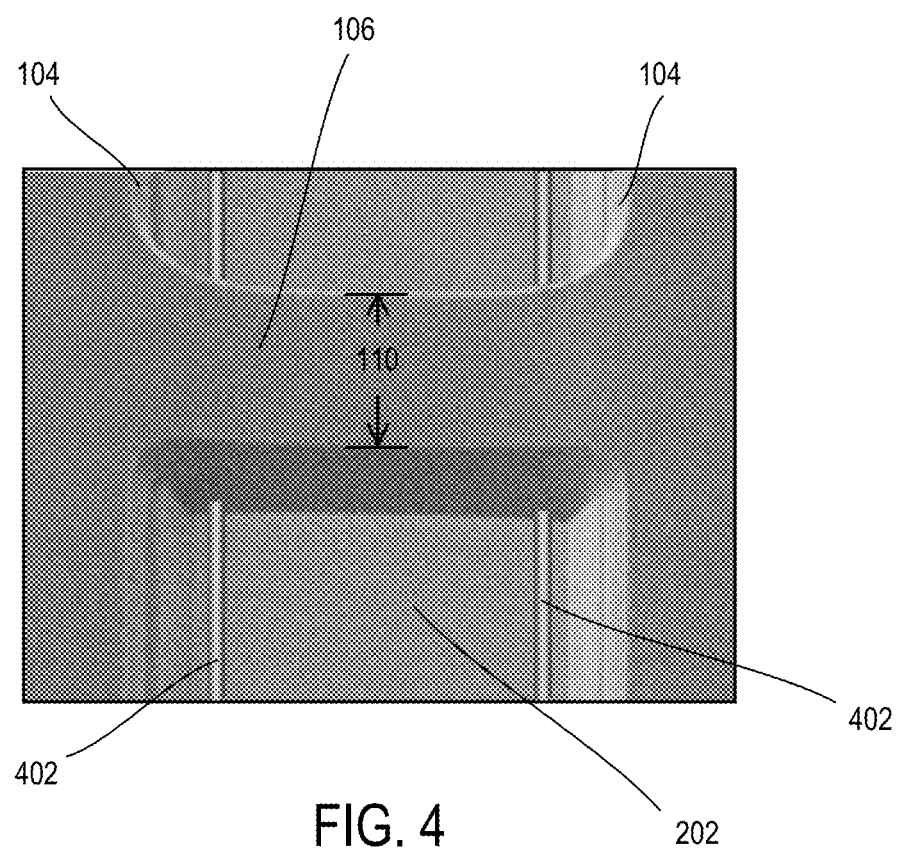
FIG. 4 illustrates an oblique close-up view of dielectric bridge 106 spanning across a dicing street area 202 between two adjacent dielectric edges 104 and further spanning over two topographical features 402 (e.g., guard rings, etc.) located at the die edge.

FIG. 4 illustrates an oblique close-up view, according to one embodiment, of dielectric bridge 106 spanning across the dicing street area 202 between two adjacent dielectric edges 104 and spanning over two die edge topographical features 402. These topographical features may be a part of the design or processing of a semiconductor die. Examples of such features include guard rings or other similar features constructed around the perimeter of the die. The use of a dielectric bridge 106 over dicing street area 202 and features 402 allows a subsequently-deposited metal seed layer to electrically connect adjacent die with minimized risk of a break in the seed layer. In FIG. 4, dielectric bridge 106 has a width 110.

Figure 5A:
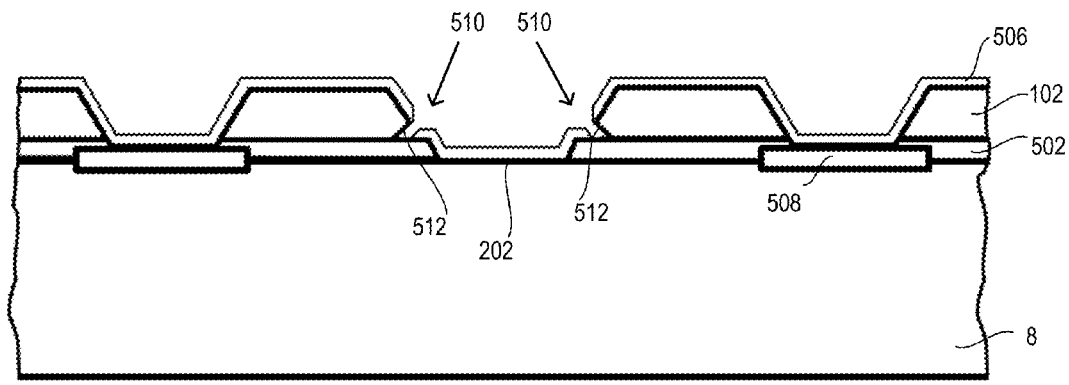
FIG. 5A illustrates a cross-sectional view of a dicing street area 202 between two adjacent die for which a metal seed layer 506 exhibits breaks 510 due to a lifted dielectric layer 512 at the die edges that cause affected die to be electrically isolated during a subsequent plating process.

FIG. 5A illustrates a cross-sectional view of a dicing street area 202 between two adjacent die, but for which no dielectric bridge is used (such as described for FIG. 5B below). The die have been coated with both an underlying dielectric layer 502 and a top dielectric layer 102, with each dielectric layer terminating at the die edges leaving the dicing street area 202 uncovered. Top dielectric layer 102 has a retrograde sidewall slope near its base where the edge has slightly lifted up or has been undercut 512. An electrically-conductive seed layer 506 has been deposited on top of top dielectric layer 102 and over the dicing street area 202. Due to the retrograde sidewall slope in top dielectric layer 102, the metal seed layer 506 has breaks 510 in it which would cause affected die to be electrically isolated during subsequent additive electroplating processes.

Figure 5B:
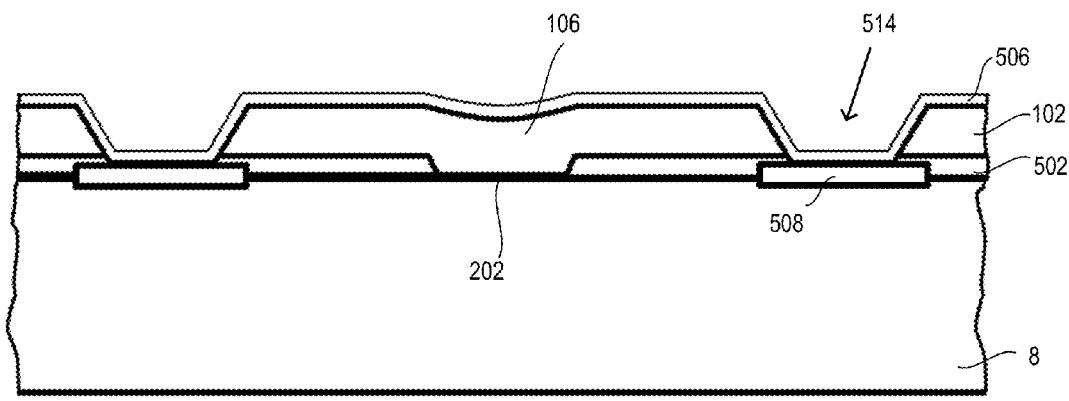
FIG. 5B illustrates the cross-sectional view as shown in FIG. 5A except that a dielectric bridge 106 is provided between the two adjacent die, according to one embodiment.

FIG. 5B illustrates, according to one embodiment, the same cross-sectional view as shown in FIG. 5A except in-between the two adjacent die there is a dielectric bridge 106 formed as part of top dielectric layer 102. An electrically-conductive seed layer 506 has been deposited on top of the top dielectric layer 102. This cross-sectional view through the bridge location shows the continuous seed layer 506 created over the dicing street area 202, which provides an electrically conductive path for use during electroplating. Feature 514 is an opening in top dielectric layer 102 and underlying dielectric layer 502 to a further underlying base metal pad 508, which is the targeted location on metal seed layer 506 where the subsequent additive electroplating is performed (the targeted location is defined by a patterned photoresist layer as described herein, and a portion of this pattern is over metal pad 508).

Figure 6A:
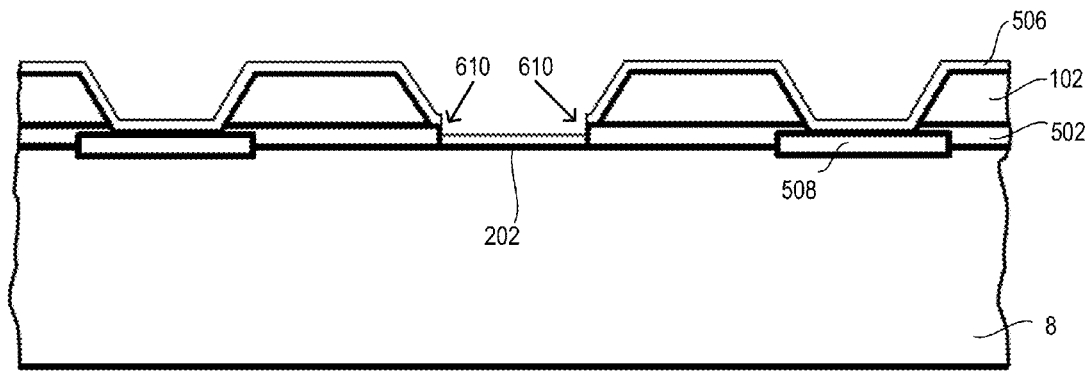
FIG. 6A illustrates a cross-sectional view of a dicing street area 202 between two adjacent die for which a metal seed layer 506 exhibits breaks due to a vertical sidewall 610 of a dielectric layer 502 at the die edges that cause affected die to be electrically isolated during a subsequent plating process.

FIG. 6A illustrates the cross-sectional view of a dicing street area 202 between two adjacent die, but for which no dielectric bridge is used (such as described for FIG. 6B below). The die have been coated with both an underlying dielectric layer 502 and a top dielectric layer 102 with each dielectric layer terminating at its die edges leaving the dicing street area 202 uncovered. The underlying dielectric layer 502 has a vertical sidewall slope 610 at its edge. An electrically-conductive metal seed layer 506 has been deposited on top of the top dielectric layer 102 and over the dicing street area 202. Due to the vertical sidewall slope in the underlying dielectric layer 502, the metal seed layer 506 has breaks in it which would cause affected die to be electrically isolated during subsequent additive electroplating processes.

Figure 6B:
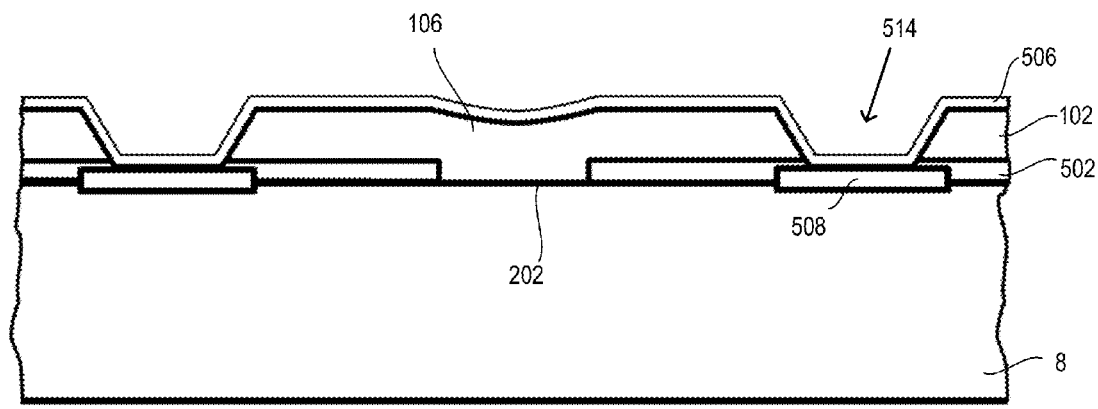
FIG. 6B illustrates the cross-sectional view as shown in FIG. 6A except that a dielectric bridge 106 is provided between the two adjacent die, according to one embodiment.

FIG. 6B illustrates, according to one embodiment, the same cross-sectional view as shown in FIG. 6A except in-between the two adjacent die there is a dielectric bridge 106 comprised of the top dielectric layer 102. An electrically conductive seed layer (e.g., a metal seed layer) has been deposited on top of the top dielectric layer 102. This cross-sectional view through the bridge location shows the continuous seed layer created over the dicing street area 202 and the electrically conductive path it provides for use in electroplating. Feature 514 is an opening in the top dielectric layer 102 and underlying dielectric layer 502 to a further underlying base metal pad 508 and is the targeted location on the metal seed layer 506 where the subsequent additive electroplating will occur to form a UBM or a metal trace that makes contact to base metal pad 508. This targeted location is defined by a patterned photoresist layer (not shown) as described herein. The targeted location defined by this pattern includes at least a portion of the area over metal pad 508 where the UBM will be formed, or the area where the metal trace will be formed (the metal trace may be, for example, a redistribution trace extending onto the top of dielectric layer 102).

Figure 7A:
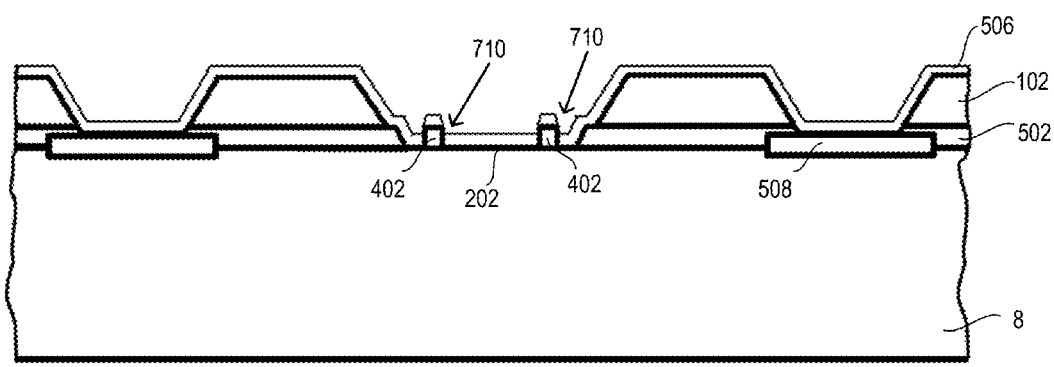
FIG. 7A illustrates a cross-sectional view of a dicing street area 202 between two adjacent die for which a metal seed layer 506 exhibits breaks due to vertical sidewalls 710 on topographical features 402 (e.g., guard rings, etc.) near the die edges that cause affected die to be electrically isolated during a subsequent plating process.

FIG. 7A illustrates the cross-sectional view of a dicing street area 202 between two adjacent die, but for which no dielectric bridge is used (such as described for FIG. 7B below). The die have been coated with both an underlying dielectric layer 502 and a top dielectric layer 102 with both dielectric layers terminating at the die edges leaving the dicing street area 202 uncovered. Near the die edge on both sides of the dicing street area 202, two topographical features 402 (such as guard rings used around the perimeter of each die, etc.) each have a vertical sidewall 710 with a slope at their respective edges. An electrically-conductive seed layer 506 has been deposited on top of the top dielectric layer 102 and over the dicing street area 202. Due to the vertical sidewall slope in the topographical features 402, the metal seed layer 506 has breaks in it which would cause affected die to be electrically isolated during subsequent additive electroplating processes.

Figure 7B:
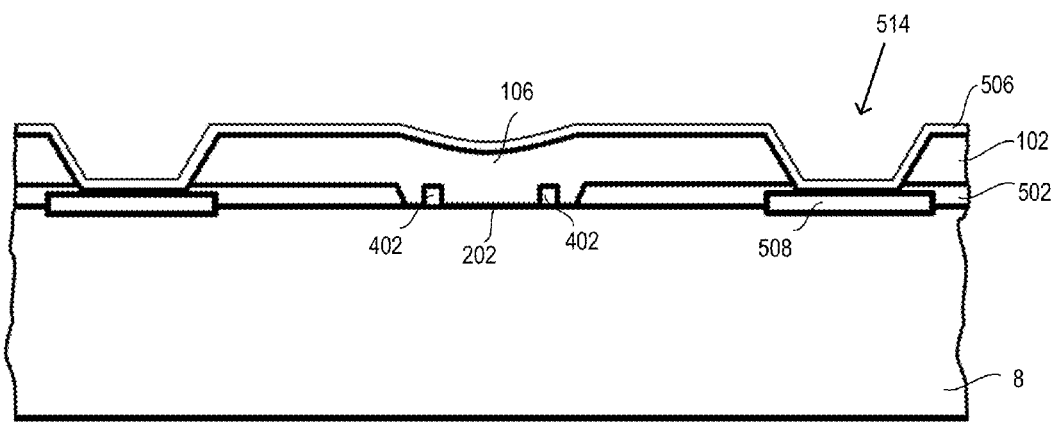
FIG. 7B illustrates the cross-sectional view as shown in FIG. 7A except that a dielectric bridge 106 is provided between the two adjacent die, according to one embodiment.

FIG. 7B illustrates, according to one embodiment, the same cross-sectional view as shown in FIG. 7A except between the two adjacent die there is a dielectric bridge 106 comprised of the top dielectric layer 102. An electrically conductive seed layer 506 has been deposited on top of the top dielectric layer 102. This cross-sectional view through the bridge location shows the continuous seed layer 506 created over the dicing street area 202 and the electrically conductive path it provides. Feature 514 is an opening in the top dielectric layer 102 and underlying dielectric layer 502 to a further underlying metal pad 508 and is the targeted location on the metal seed layer 506 where the subsequent additive electroplating will occur (the targeted location may be defined by a patterned photoresist layer as described herein, and this pattern includes at least a portion of the area over metal pad 508).

This disclosure includes, in various embodiments, using any number of dielectric bridges in any direction over the dicing street areas and over any other localized on-chip topography (e.g., features 402 above). In one example, the dicing street area 202 may have a width of 10 um to 200 um ("um" as used herein indicates microns). Each dielectric bridge may cross the dicing street area orthogonal to its major axis, or at an angle thereto (e.g., crossing the dicing street area diagonally).

In a typical embodiment, a dielectric bridge is between 3 um to 300 um in width as it crosses the dicing street area so as to minimize the cross-sectional area to be diced through, but still be wide enough to supply the necessary electrical current through a subsequently added seed layer capable of plating across the targeted areas of the wafer surface. In another embodiment, the dielectric bridge can have a width up to thirty-five percent (35%) of device die dimension 108. In FIG. 3, as mentioned above, dielectric bridge 106 has a width 110 (as generally determined at the middle of dicing street area 202).

In one embodiment, the dielectric bridges can vary in thickness between 0.5 um to 100 um. The dielectric bridges can be comprised of one or more layers of the same dielectric or different dielectrics either on top of each other, overlapping each other, or adjacent to each other.

In general, the dielectric bridges can be comprised of any type of dielectric material. Examples of the types of dielectric material that can be used for this structure and method include, but are not limited to, the following: polybenzoxazole (PBO), benzocyclobutene (BCB), polyimide (PI), silicon nitride, silicon dioxide, silicon oxynitride, etc.

The methods for forming the dielectric bridges with various iterations that connect dielectric layer(s) on each die over the die street areas can be accomplished generally using any known dielectric deposition, masking, photolithography, etching, developing, etc., technique.

To further describe the metal seed layer as used in various embodiments, it can be comprised of one, two or more conductive metal(s) (either a single metal or as a metal stack) deposited over the desired dielectric(s) in one embodiment by conventional high-vacuum deposition methods (e.g., sputtering, evaporation, etc.). The art of depositing a metal seed layer in the industry is generally used to provide a continuous seed layer pathway for electrochemical plating and to provide adhesion to the underlying dielectric layer and underlying pad metal. Possible metal seed layers include, but are not limited to, the following (note: each exemplary stack in the following uses the convention of lower layer/upper layer): Au, Ti/Au, TiW/Au, Cu, Ti/Cu, W/Cu, TiW/Cu, Ti/Ni/Cu, Ti/Ni(V)/Cu, Al/Ni/Cu, Al/Ni(V)/Cu, Cr/Cu, Cr/Ni/Cu, Cr/Ni(V)/Cu, etc.

Atop the metal seed layer there is usually a deposited masking resist (not shown) that defines the targeted areas for electroplating metal structures on the semiconductor device. The masking resist can be coated, laminated, or deposited through various approaches. In one approach, the masking resist can be a photoresist material that is defined by a photolithography process. The purpose of the masking resist is to block a plating solution from having contact with the metal seed layer at the locations where plating is not desired. Following the additive plating process, this resist layer is generally removed using strip, etch, or other methods known in the industry.

Following the removal of the masking resist after the electroplating process, the deposited metal seed layer is generally removed from the wafer surface (in the areas where the patterned plating did not occur) using a type of etching process.

In one embodiment, portions of the dielectric bridges that had crossed the dicing street area remain after manufacturing is completed (i.e., there are remnants of the dielectric bridge(s) at the edge of the die following singulation). In one embodiment, the dielectric bridges may be used with any package having an integrated circuit.

Various additional, non-limiting embodiments are now described below. In a first embodiment, a structure and method provide a continuous current pathway of a deposited metal seed layer for additive plating processes on semiconductor devices using dielectric material(s) to create bridges beneath the seed layer that cross the dicing street areas as well as any other localized on-chip topography with the bridges having gradual surface slopes that ensure an electrically-continuous seed layer to all the targeted die areas over the surface of a semiconductor wafer.

In another embodiment, a structure and method provide a continuous current pathway of a deposited metal seed layer by using dielectric bridges beneath the seed layer that cross the dicing street areas as well as any other localized on-chip topography using any variety or type of dielectric material, and any number of dielectric layers, whether stacked on top of each other, overlapping each other, or adjacent to each other.

In one embodiment, a structure and method provide a continuous current pathway of a deposited metal seed layer by using dielectric bridges beneath the seed layer that cross the dicing street areas as well as any other localized on-chip topography using any method of forming dielectric layers.

In one embodiment, a structure and method provide a continuous current pathway of a deposited metal seed layer by using dielectric bridges beneath the seed layer that cross the dicing street areas as well as any other localized on-chip topography where any number of bridges extending to adjacent die (i.e., adjacent in any direction up, down, right, or left) can be used.

In one embodiment, a structure and method provide a continuous current pathway of a deposited metal seed layer by using dielectric bridges beneath the seed layer that cross the dicing street areas where the bridges can vary in width between 3 um to 300 um so as to minimize the cross-sectional area, but be wide enough to supply sufficient electrical current for plating across the wafer surface. In another embodiment, the dielectric bridge can have a width up to thirty-five percent (35%) of device die dimension 108.

In one embodiment, a structure and method provide a continuous current pathway of a deposited metal seed layer by using dielectric bridges beneath the seed layer that cross the dicing street areas as well as any other localized on-chip topography.

In one embodiment, a structure and method provide a continuous current pathway of a deposited metal seed layer by using dielectric bridges beneath the seed layer that cross the dicing street areas as well as any other localized on-chip topography where the dielectric bridges are between 0.5 um to 100 um in thickness.

In one embodiment, a structure and method provide a continuous current pathway of a deposited metal seed layer by using dielectric bridges beneath the seed layer that cross the dicing street areas as well as any other localized on-chip topography that may interfere in a similar way in achieving a continuous metal seed layer. Additionally, each of the dielectric bridges may have various shapes including, but not limited to, rectangular, oval, hexagonal, etc., as may be desirable or optimal for a specific application.

In one embodiment, a structure and method provide a current pathway by a conductive layer for a plating process on a semiconductor device by using at least one dielectric material to create one or more bridges beneath the conductive layer that cross at least one dicing street area. In one embodiment, each bridge connects at least two respective dielectric layer regions (i.e., a region is a portion of a dielectric layer overlying a semiconductor wafer located over one particular die) of at least two adjacent die.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A method, comprising:
    providing a semiconductor wafer comprising a plurality of die, the plurality of die including a first die and a second die, wherein the first die is adjacent to the second die, and the first die and second die are separated by a dicing street area;
    forming a patterned dielectric layer overlying the semiconductor wafer, the dielectric layer comprising at least one dielectric bridge that crosses the dicing street area;
    forming a conductive layer overlying the dielectric layer, a portion of the conductive layer overlying the at least one dielectric bridge to provide a current pathway from the first die to the second die; and
    electroplating targeted areas of the conductive layer, wherein the electroplating comprises providing current to the second die using the current pathway.

2. The method of claim 1, further comprising forming a resist layer overlying the conductive layer, and patterning the resist layer to define the targeted areas.

3. The method of claim 1, wherein the patterned dielectric layer comprises a plurality of openings to expose a base metal, and the targeted areas are portions of the conductive layer overlying the exposed base metal.

4. The method of claim 1, wherein the first die is located closer to an edge of the semiconductor wafer than the second die.

5. The method of claim 1, wherein each dielectric bridge has a width of 3 to 300 microns.

6. The method of claim 1, wherein the first die has a device die dimension, each dielectric bridge has a minimum width of 3 microns, and each dielectric bridge has a maximum width of 35 percent of the device die dimension.

7. The method of claim 1, wherein the conductive layer is a metal seed layer.

8. The method of claim 7, wherein the forming of the conductive layer comprises metal deposition by sputtering or evaporating the metal seed layer.

9. The method of claim 1, further comprising singulating the wafer along the dicing street area to separate the first die from the second die.

10. The method of claim 1, wherein the dielectric layer is a photoimageable dielectric.

11. The method of claim 1, further comprising, prior to forming the patterned dielectric layer, forming at least one localized on-chip topographic feature on each of the plurality of die, wherein the patterned dielectric layer further comprises openings that expose at least a portion of each topographic feature.

12. The method of claim 1, wherein each dielectric bridge has a shape that is rectangular, oval, or hexagonal.

13. The method of claim 1, wherein the plurality of die further includes a third die and a fourth die, each adjacent to the first die, and wherein the dielectric layer further comprises respective dielectric bridges from the first die to the third die and from the first die to the fourth die, each respective dielectric bridge crossing a dicing street area.

14. The method of claim 1, wherein the patterned dielectric layer is a second dielectric layer, and further comprising, prior to forming the second dielectric layer, forming a first dielectric layer overlying the semiconductor wafer, and wherein the second dielectric layer is formed overlying the first dielectric layer.

15. The method of claim 14, wherein the second dielectric layer comprises polybenzoxazole, benzocyclobutene, or polyimide.

16. The method of claim 1, wherein each dielectric bridge has a thickness of 0.5 to 100 microns.

17. The method of claim 1, wherein each dielectric bridge comprises two or more layers of dielectric material, and wherein the two or more layers of dielectric material are stacked on each other, overlapping each other, or adjacent to each another.

18. A structure, comprising:
   a semiconductor wafer comprising a plurality of die, the plurality of die including a first die and a second die, wherein the first die is adjacent to the second die, and the first die and second die are separated by a dicing street area;
   a patterned dielectric layer overlying the semiconductor wafer, the dielectric layer comprising at least one dielectric bridge that crosses the dicing street area; and
   a metal seed layer overlying the dielectric layer, a portion of the seed layer overlying the at least one dielectric bridge configured to provide a current pathway from the first die to the second die during electroplating of targeted areas of the metal seed layer.

19. The structure of claim 18, wherein the patterned dielectric layer comprises a plurality of openings to expose a base metal, and the targeted areas are portions of the metal seed layer overlying the exposed base metal.

20. The structure of claim 19, further comprising a resist layer overlying the metal seed layer, wherein a pattern of the resist layer defines the targeted areas.

\* \* \* \* \*